United States Patent
Mou et al.

(10) Patent No.: US 11,295,648 B2
(45) Date of Patent: Apr. 5, 2022

(54) GATE DRIVE UNIT, GATE DRIVE CIRCUIT AND DISPLAY APPARATUS AND DRIVING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Guangying Mou, Beijing (CN); Jideng Zhou, Beijing (CN); Yifeng Zou, Beijing (CN); Fengzhen Lv, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 16/760,062

(22) PCT Filed: Dec. 6, 2019

(86) PCT No.: PCT/CN2019/123538
§ 371 (c)(1),
(2) Date: Apr. 29, 2020

(87) PCT Pub. No.: WO2020/177428
PCT Pub. Date: Sep. 10, 2020

(65) Prior Publication Data
US 2021/0225235 A1    Jul. 22, 2021

(30) Foreign Application Priority Data
Mar. 1, 2019 (CN) .......................... 201910156622.6

(51) Int. Cl.
  *G09G 3/20*  (2006.01)
  *G11C 19/28* (2006.01)

(52) U.S. Cl.
  CPC ............. *G09G 3/20* (2013.01); *G09G 3/2092* (2013.01); *G11C 19/28* (2013.01);
  (Continued)

(58) Field of Classification Search
  CPC ............. G09G 3/20; G09G 2310/0267; G09G 2310/0286; G09G 3/2092; G11C 19/28
  See application file for complete search history.

(56) References Cited

U.S. PATENT DOCUMENTS 9,153,342 B2  10/2015  Gu et al.
9,830,877 B2  11/2017  Huang
(Continued)

FOREIGN PATENT DOCUMENTS

CN    103021318 A    4/2013
CN    104700806 A    6/2015
(Continued)

OTHER PUBLICATIONS

International Search Report dated Mar. 4, 2020, issued in counterpart Application No. PCT/CN2019/123538. (11 pages).

*Primary Examiner* — Xuemei Zheng
(74) *Attorney, Agent, or Firm* — WHDA, LLP

(57) ABSTRACT

The present disclose is related to a gate drive unit. The gate drive unit may include a shift register; and a signal filter. The signal filter may respectively connect to a clock signal terminal, a filter output terminal, an input terminal and a reset terminal. The signal filter may be configured, under control of an effective signal provided by the input terminal, to transmit a clock signal of the clock signal terminal to the filter output terminal after the input terminal stops providing the effective signal and before the reset terminal provides an (Continued)

effective signal and, under control of an effective signal provided by the reset terminal, to disconnect the clock signal terminal and the filter output terminal.

20 Claims, 8 Drawing Sheets

(52) U.S. Cl.
CPC ............... *G09G 2300/0408* (2013.01); *G09G 2300/0426* (2013.01); *G09G 2310/0267* (2013.01); *G09G 2310/0286* (2013.01); *G09G 2310/08* (2013.01); *G09G 2330/02* (2013.01)

(56) References Cited

U.S. PATENT DOCUMENTS

| | | | |
|---|---|---|---|
| 10,095,058 | B2 | 10/2018 | Wang et al. |
| 2017/0364170 | A1* | 12/2017 | Gu .......................... G09G 3/36 |
| 2019/0066617 | A1 | 2/2019 | Zhao et al. |
| 2020/0160805 | A1* | 5/2020 | Hong ................... G09G 3/3696 |

FOREIGN PATENT DOCUMENTS

| | | |
|---|---|---|
| CN | 105096879 A | 11/2015 |
| CN | 105938711 A | 9/2016 |
| CN | 106875911 A | 6/2017 |
| CN | 107527587 A | 12/2017 |
| CN | 109671386 A | 4/2019 |
| KR | 20070047112 A | 5/2007 |

* cited by examiner

Related Art

GATE DRIVE UNIT, GATE DRIVE CIRCUIT AND DISPLAY APPARATUS AND DRIVING METHOD THEREOF

CROSS-REFERENCE TO RELATED APPLICATIONS

This application claims benefit of the filing date of Chinese Patent Application No. 201910156622.6 filed on Mar. 1, 2019, the disclosure of which is hereby incorporated in its entirety by reference.

TECHNICAL FIELD

The present disclosure relates to the display technologies and, more particularly, to a gate drive unit, a gate drive circuit, a display apparatus, and a driving method thereof.

BACKGROUND

A gate drive circuit of a display apparatus includes a plurality of cascaded shift registers. The plurality of cascaded shift registers sequentially output scanning signals. The current technology generally implements the gate drive circuit to turn on the corresponding pixels through the shift registers.

BRIEF SUMMARY

One embodiment of the present disclosure provides a gate drive unit. The gate drive unit may include a shift register; and a signal filter. The signal filter may respectively connect to a clock signal terminal, a filter output terminal, an input terminal and a reset terminal. The signal filter may be configured, under control of an effective signal provided by the input terminal, to transmit a clock signal of the clock signal terminal to the filter output terminal after the input terminal stops providing the effective signal and before the reset terminal provides an effective signal and, under control of an effective signal provided by the reset terminal, to disconnect the clock signal terminal and the filter output terminal.

Optionally, the shift register may include a first pre-charging circuit, an output circuit, and a first reset circuit. The first pre-charging circuit may be connected to the input terminal and a first pull-up node, and may be configured to pre-charge the first pull-up node under control of the effective signal provided by the input terminal. The first reset circuit may be connected to the reset terminal, the first pull-up node, and a first power terminal, and may be configured to transmit, under control of the effective signal provided by the reset terminal, a signal provided by the first power terminal to the first pull-up node. The output circuit may be connected to the filter output terminal, the first pull-up node and a signal output terminal, and may be configured to transmit a signal of the filter output terminal to the signal output terminal when the first pull-up node may be at an effective potential.

Optionally, the signal filter may include a second pre-charging circuit, a second reset circuit, and a filter circuit. The second pre-charging circuit may be connected to the input terminal and a second pull-up node, and may be configured to pre-charge the second pull-up node under control of the effective signal provided by the input terminal. The filter circuit may be connected to the second pull-up node, the clock signal terminal, and the filter output terminal, and may be configured to transmit the clock signal from the clock signal terminal to the filter output terminal when the second pull-up node is at an effective potential. The second reset circuit may be connected to the reset terminal, the second pull-up node and the first power terminal, and may be configured to transmit the signal of the first power terminal to the second pull-up node under control of an effective signal provided by the reset terminal.

Optionally, the second pre-charging circuit may include a second pre-charging transistor. A gate and a first terminal of the second pre-charging transistor may be connected to the input terminal, and a second terminal of the second pre-charging transistor may be connected to the second pull-up node.

Optionally, the second reset circuit may include a second reset transistor, a gate of the second reset transistor may be connected to the reset terminal, a first terminal of the second reset transistor may be connected to the second pull-up node, and a second terminal of the second reset transistor may be connected to the first power terminal.

Optionally, the filter circuit may include a filter transistor and a second capacitor. A gate of the filter transistor may be connected to the second pull-up node, a first terminal of the filter transistor may be connected to the clock signal terminal, a second terminal of the filter transistor may be connected to the filter output terminal, and two electrodes of the second capacitor may be respectively connected to the second pull-up node and the filter output terminal.

Optionally, the signal filter further may include a third reset circuit, the third reset circuit may be connected to the reset terminal, the filter output terminal, the first power terminal, and may be configured to transmit the signal of the first power terminal to the filter output terminal under control of the effective signal provided by the reset terminal.

Optionally, the third reset circuit may include a third reset transistor. A gate of the third reset transistor may be connected to the reset terminal, a first terminal of the third reset transistor may be connected to the filter output terminal, and a second terminal of the third reset transistor may be connected to the first power terminal.

Optionally, the first pre-charging circuit may include a first pre-charging transistor. A gate and a first terminal of the first pre-charging transistor may be connected to the input terminal, and a second terminal of the first pre-charging transistor may be connected to the first pull-up node. The first reset circuit may include a first reset transistor. A gate of the first reset transistor may be connected to the reset terminal, a first terminal of the first reset transistor may be connected to the first pull-up node, and a second terminal of the reset transistor may be connected to the first power terminal.

Optionally, the signal output terminal may include a first output terminal and a second output terminal. The output circuit may include a first output transistor, a second output transistor, and a first capacitor. A gate of the first output transistor may be connected to the first pull-up node, a first terminal of the first output transistor may be connected to the filter output terminal, and a second terminal of the first output transistor may be connected to the first output terminal. A gate of the second output transistor may be connected to the first pull-up node, a first terminal of the second output transistor may be connected to the filter output terminal, a second terminal of the first output transistor may be connected to the second output terminal. Two electrodes of the first capacitor may be respectively connected to the first pull-up node and the second output terminal.

Optionally, the signal output terminal may include a first output terminal and a second output terminal. The shift register may further include a first pull-down control circuit, a first pull-down circuit, a second pull-down control circuit, and a second pull-down circuit. The first pull-down control circuit may be connected to the first pull-up node, a first pull-down node, the first power terminal and a second power terminal; and may be configured to transmit a signal from the first power terminal to the first pull-down node when the first pull-up node may be at an effective potential, and to transmit a signal from the second power terminal to the first pull-down node when the first pull-up node is at an ineffective potential. The first pull-down circuit may be connected to the first pull-down node, the first pull-up node, the signal output terminal, the first power terminal and a fourth power terminal, and may be configured to transmit the signal from the first power terminal to the first pull-up node and the first output terminal and to transmit a signal from the fourth power terminal to the second output terminal when the first pull-down node is at an effective potential. The second pull-down control circuit may be connected to the first pull-up node, a second pull-down node, the first power terminal, and a third power terminal, and may be configured to transmit the signal from the first power terminal to the second pull-down node when the first pull-up node may be at an effective potential and to transmit a signal from the third power terminal to the second pull-down node when the first pull-up node is at an ineffective potential. The second pull-down circuit may be connected to the second pull-down node, the first pull-up node, the signal output terminal, the first power terminal, and the fourth power terminal, and may be configured to transmit the signal from the first power terminal to the first pull-up node and the first output terminal and transmit the signal from the fourth power terminal to the second output terminal when the second pull-down node is at an effective voltage. The signals from the second power terminal and the third power terminal may be signals switching between an effective voltage and an ineffective voltage. One of the signals from the second power terminal and the third power terminal may be at the effective voltage and the other may be at the ineffective voltage.

Optionally, the first pull-down control circuit may include a first pull-down control transistor, a second pull-down control transistor, a third pull-down control transistor and a fourth pull-down control transistor. A gate and a first terminal of the first pull-down control transistor may e connected to the second power terminal, a second terminal of the first pull-down control transistor may be connected to a gate of the second pull-down control transistor and a first terminal of the third pull-down transistor. A first terminal of the second pull-down control transistor may be connected to the second power terminal, and a second terminal of the second pull-down control transistor may be connected to the first pull-down node. A gate of the third pull-down control transistor may be connected to the first pull-up node, and a second terminal of the third pull-down control transistor may be connected to the first power terminal. A gate of the fourth pull-down control transistor may be connected to the first pull-up node, a first terminal of the fourth pull-down control transistor may be connected to the first pull-down node, and a second terminal of the fourth pull-down control transistor may be connected to the first power terminal.

Optionally, the first pull-down circuit may include a first pull-down transistor, a second pull-down transistor, and a third pull-down transistor. A gate of the first pull-down transistor, a gate of the second pull-down transistor and a gate of the third pull-down transistor may be connected to the first pull-down node, a first terminal of the first pull-down transistor may be connected to the first pull-up node, and a second terminal of the first pull-down transistor may be connected to the first power terminal. A first terminal of the second pull-down transistor may be connected to the first output terminal, and a second terminal of the second pull-down transistor is connected to the first power terminal. A first terminal of the third pull-down transistor may be connected to the second output terminal, and a second terminal of the third pull-down transistor may be connected to the fourth power terminal.

Optionally, the second pull-down control circuit may include a fifth pull-down control transistor, a sixth pull-down control transistor, a seventh pull-down control transistor and an eighth pull-down control transistor. A gate and a first terminal of the fifth pull-down control transistor may be connected to the third power terminal, a second terminal of the fifth pull-down control transistor may be connected to a gate of the sixth pull-down control transistor and a first terminal of the seventh pull-down control transistor. A first terminal of the sixth pull-down control transistor may be connected to the third power terminal, and a second terminal of the sixth pull-down control transistor may be connected to the second pull-down node. A gate of the seventh pull-down control transistor may be connected to the first pull-up node, and a second terminal of the seventh pull-down control transistor may be connected to the first power terminal. A gate of the eighth pull-down control transistor may be connected to the first pull-up node, a first terminal of the eighth pull-down control transistor may be connected to the second pull-down node, and a second terminal of the eighth pull-down control transistor may be connected to the first power terminal.

Optionally, the second pull-down circuit may include a fourth pull-down transistor, a fifth pull-down transistor, and a sixth pull-down transistor. Gates of the four pull-down transistor, the fifth pull-down transistor and the sixth pull-down transistors may be connected to the second pull-down node, a first terminal of the fourth pull-down transistor may be connected to the first pull-up node, and a second terminal of the fourth pull-down transistor may be connected to the first power terminal. A first terminal of the fifth transistor may be connected to the first output terminal, and a second terminal of the fifth pull-down transistor may be connected to the first power terminal. A first terminal of the sixth pull-down transistor may be connected to the second output terminal, and a second terminal of the six pull-down transistor may be connected to the fourth power terminal.

Another embodiment of the present disclosure provides a method for driving the gate drive unit. The method may include: providing an effective signal at the input terminal and an ineffective signal at the clock signal terminal during a pre-charging stage; providing an ineffective signal at the input terminal and an effective signal at the clock signal terminal during an output stage; and providing an effective signal at the reset terminal during a reset stage.

Another embodiment of the present disclosure provides a gate drive circuit. The gate drive circuit may include a plurality of cascaded gate drive units. At least one of the plurality of cascaded gate drive units may include the gate drive unit.

Optionally, except for the gate drive unit of the last stage, a signal output terminal of any of the gate drive units may be connected to an input terminal of a gate drive unit of the next stage; and except for the gate drive unit of the first stage, a first output terminal of any of the gate drive units may be connected to a reset terminal of the gate drive unit of the previous stage.

Another embodiment of the present disclosure provides a display apparatus. The display apparatus may include the gate drive circuit and a display panel.

Optionally, the display panel comprises a plurality of pixels, each of the plurality of pixels is connected to a date line and one of the plurality of cascaded gate drive units, the one of the plurality of cascaded gate drive units comprises a pull-up node, a first power terminal, a fourth power terminal, and a second output terminal, when the display apparatus is powered off, the pull-up node discharges through the first power terminal when an electrical connection between the first power terminal and the pull-up node is switched on; and raising a voltage of the fourth power terminal and turning on an electrical connection between the fourth power terminal and the second output terminal may make the second output terminal to output an effective signal, thereby discharging charges stored in pixels into a data line.

DETAILED DESCRIPTION

Figure 1:
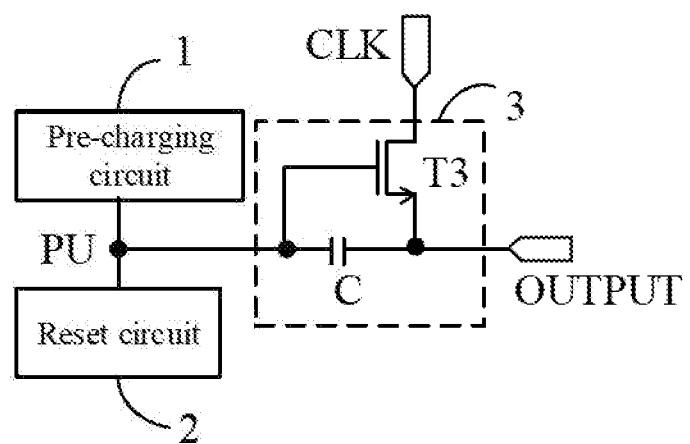
FIG. 1 is a schematic diagram of a conventional shift register.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-8. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled," "connected" and the like are not limited to physical or mechanical connections, but may include electrical connections, whether direct or indirect.

In the description of the following embodiments, specific features, structures, materials or characteristics may be combined in any suitable manner in any one or more embodiments or examples.

The shift register includes an output transistor. The gate of the output transistor is connected to a pull-down node, the first terminal of the output transistor is connected to a clock signal terminal, and the second terminal of the output transistor is connected to the output terminal of the shift register. During input and output stages of the shift register, the output transistor is tuned on under control of a pull-up node so that a signal of a clock signal terminal is directly transmitted through the output transistor to the output terminal of the shift register.

The clock signal terminal supplies a clock signal switching between high and low levels to the output transistor. Since the output transistor itself has a certain capacitance, after the output stage, when the clock signal terminal reaches a high level, the gate potential of the output transistor will be slightly increased, so that the second terminal of the output transistor outputs a certain signal. Accordingly, some noise is generated.

FIG. 1 illustrates a schematic diagram of a conventional shift register in related art. The shift register includes a pre-charging circuit 1, a reset circuit 2 and an output circuit 3. The output circuit 3 includes an output transistor T3 and a capacitor C. The pre-charging circuit 1, the reset circuit 2 and the output circuit 3 are connected to a pull-up node PU, and the output transistor T3 is connected directly to a clock signal terminal CLK. During a pre-charging stage, the pre-charging circuit 1 charges the pull-up node PU, and the output transistor T3 transmits an ineffective clock signal from the clock signal terminal to the output terminal OUTPUT. During an output stage, the output transistor T3 transmits an effective clock signal from the clock signal terminal to the output terminal OUTPUT. During a reset stage, the reset circuit 2 resets the pull-up node PU. After the reset stage, when the clock signal terminal CLK reaches the high level, the gate potential of the output transistor T3 is slightly increased, so that the second terminal of the output transistor T3 outputs a certain signal, thereby generating a certain noise.

In order to solve the noise problem caused by the clock signal terminal directly supplying the clock signal to the output transistor of the shift register in the prior art, some embodiments of the present disclosure provide a gate drive unit, a gate drive circuit and a display apparatus. The technical solutions according to various embodiments of the present disclosure are described in detail hereinafter in conjunction with the drawings.

First, it should be noted that a transistor in the present disclosure may be a thin film transistor, a field effect transistor or other switching devices. One of the first and second terminals of the transistor is a source of the transistor and the other is a drain of the transistor Further, in the present disclosure, an "effective voltage" is a voltage capable of turning on a transistor, and an "ineffective voltage" is a voltage that turns off a transistor. An "effective signal" is a signal capable of turning on a transistor, and an "ineffective signal" is a signal that turns off a transistor. For an N-type transistor, the effective voltage is a high level voltage and the ineffective voltage is a low level voltage; the effective signal is a high level signal, and the ineffective signal is a low level signal. For a P-type transistor, the effective voltage is a low level voltage and the ineffective voltage is a high level voltage; the effective signal is a low level signal and the ineffective signal is a high level signal.

In the present disclosure, examples in which each transistor is anN-type transistor will be exemplified. At this time, the effective signal is a high level signal, and the ineffective signal is a low level signal; the effective voltage is a high level voltage, and the ineffective voltage is a low level voltage.

Figure 2:
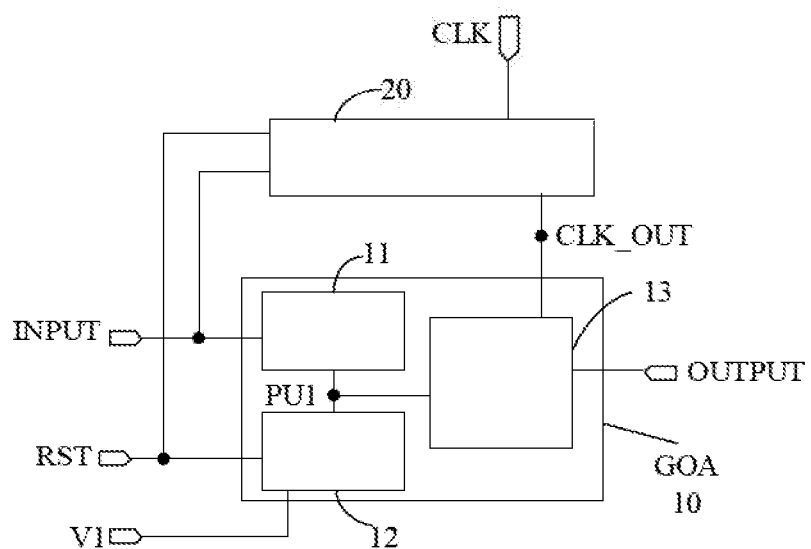
FIG. 2 is a schematic diagram of a gate drive unit according to some embodiments of the present disclosure.

FIG. 2 illustrates a schematic diagram of a gate drive unit according to some embodiments of the present disclosure. The gate drive unit includes a shift register GOA 10 and a signal filter 20. The shift register GOA comprises: a first pre-charging circuit 11, a first reset circuit 12 and an output circuit 13. The first pre-charging circuit 11, the first reset circuit 12, and the output circuit 13 are connected to the first pull-up node PU1.

In one embodiment, the signal filter 20 is respectively connected to the clock signal terminal CLK, the filter output terminal CLK_OUT, the input terminal INPUT and reset terminal RST of the shift register GOA. The signal filter is configured to transmit the signal of the clock signal terminal CLK to the filter output terminal CLK_OUT under the control of the effective signal provided by the input terminal INPUT after the input terminal INPUT stops providing the effective signal and before the reset terminal RST provides the effective signal, and to disconnect the clock signal terminal CLK from the filter output terminal CLK_OUT under the control of the effective signal provided by the reset terminal RST.

In one embodiment, the first pre-charging circuit 11 is connected to the input terminal INPUT and the first pull-up node PU1, and pre-charges the node PU1 under control of an effective signal provided by the input terminal INPUT.

In one embodiment, the first reset circuit 12 is respectively connected to the reset terminal RST, the first pull-up node PU1, and a first power terminal V1. The first reset circuit 12 is configured to, under control of an effective signal provided by the rest terminal RST, transmit a signal provided by the first power terminal V1 to the first pull-up node PU1. The first power terminal V1 provides an ineffective signal.

In one embodiment, the output circuit 13 is connected to the filter output terminal CLK_OUT, the first pull-up node PU1 and the signal output terminal OUTPUT for transmitting the signal of the filter output terminal CLK_OUT to the output terminal OUTPUT when the first pull-up node PU1 is at the effective voltage. Therefore, the normal output of the shift register GOA in the output stage can be guaranteed. During the operation of the gate drive unit, the clock signal terminal CLK supplies a clock signal that switches between high and low levels. During the pre-charging stage, the clock signal stays in a low level; and during the output stage, the clock signal stays high. The signal filter 20 transmits, during the pre-charging and the output stages, the signal from the clock signal terminal CLK to the shift register GOA, thereby ensuring normal output of the shift register GOA in the output stage. During the reset stage, the clock signal terminal CLK and the filter output terminal CLK_OUT are disconnected. Thus, during and after the reset stage, when the clock signal terminal CLK provides a high level signal, the high level signal does not enter the shift register GOA, thereby ensuring the low potential of the first pull-up node PU1, and preventing the shift register GOA from generating noise during the reset stage and after the reset stage.

Figure 3:
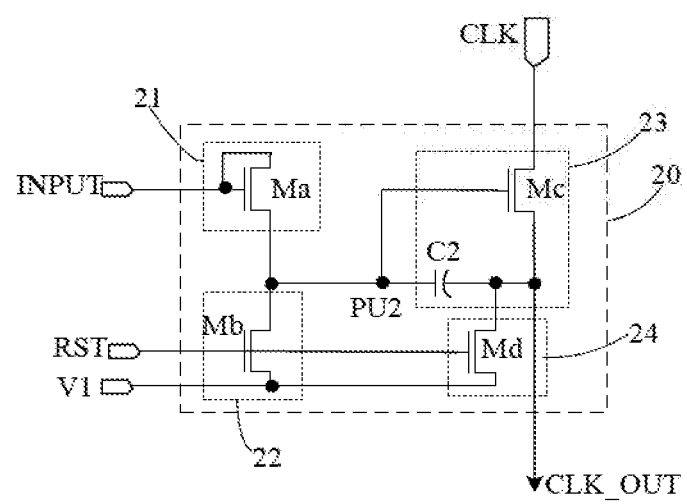
FIG. 3 is a schematic diagram of a signal filter according to some embodiments of the present disclosure.

FIG. 3 illustrates a schematic view of a signal filter of a gate drive unit according to some embodiments of the present disclosure. The signal filter 20 includes a second pre-charging circuit 21, a second reset circuit 22 and a filter circuit 23.

The second pre-charging circuit 21 is connected to the input terminal INPUT and a second pull-up node PU2. Under control of an effective signal provided by the input terminal INPUT, the second pre-charge circuit 21 pre-charges the second pull-up node PU2.

The filter circuit 23 is connected to the clock signal terminal, the second pull-up node PU2, and the filter output terminal CLK_OUT for transmitting the signal from the clock signal terminal to the filter output terminal CLK_OUT when the second pull-up node PU2 is at the effective voltage.

The second reset circuit 22 is connected to the reset terminal RST, the second pull-up node PU2, and the first power terminal V1. The second reset circuit is configured to transmit the signal from the first power terminal V1 to the second pull-up node PU2 under control of an effective signal provided by the reset terminal RST.

During the input stage of the gate drive unit, the input terminal INPUT pre-charges the second pull-up node PU2 so that the filter circuit 23 transmits the low level signal from the clock signal terminal CLK to the filter output terminal CLK_OUT and then to the shift register GOA. During the output stage of the gate drive unit, the second pull-up node PU2 may remain at a high voltage so that the filter circuit 23 transmits the high level signal from the clock signal terminal CLK to the shift register GOA. During the reset stage, the second reset circuit 22 resets the second pull-up node PU2, thereby disconnecting the clock signal terminal CLK from the filter output terminal CLK_OUT.

In one embodiment, the signal filter 20 further includes a third reset circuit 24 and the third reset circuit 24 is connected to the reset terminal RST, the filter output terminal CLK_OUT, and the first power terminal V1. The third rest circuit is configured to transmit the signal from the power terminal V1 to the filter output terminal CLK_OUT under control of an effective signal provided by the reset terminal RST so that the filter output terminal CLK_OUT can discharge rapidly during the reset stage. After the reset stage, no high level signal is supplied to the filter output terminal CLK_OUT, thereby ensuring that no high level signal is supplied to the output transistor of the shift register GOA after the reset stage. As such, the shift register GOA is ensured to have no noise output after the reset stage.

In one embodiment, as shown in FIG. 3, the second pre-charge circuit 21 includes: a second pre-charging transistor Ma. The gate and the first terminal of the second pre-charge transistor Ma are both connected to the input terminal INPUT of the shift register GOA. The second terminal of the second pre-charging transistors Ma is connected to the second pull-up node PU2.

The second reset circuit 22 includes: a second reset transistor Mb. The gate of the second reset transistor Mb is connected to the reset terminal RST, the first terminal of the second reset transistor Mb is connected to the second pull-up node PU2, and the second terminal of the second reset transistor Mb is connected to the first power terminal V1.

The filter circuit 23 includes a filter transistor Mc and a second capacitor C2. The gate of the filter transistor Mc is connected to the second pull-up node PU2, the first terminal of the filter transistor Mc is connected to the clock signal terminal CLK, and the second terminal of the filter transistor Mc is connected to the filter output terminal CLK_OUT. The electrodes of the second capacitor C2 are respectively connected to the second pull-up node PU2 and the filter output terminal CLK_OUT.

The third reset circuit 24 includes a third reset transistor Md. The gate of the third reset transistor Md is connected to the reset terminal RST, the first terminal of the third reset transistor Md is connected to the filter output terminal CLK_OUT, and the second terminal of the third reset transistor Md is connected to the first power terminal V1.

In FIG. 3, during the pre-charging stage of the gate drive unit, the second pre-charging transistor Ma is turned on and the input terminal INPUT charges the second pull-up node PU2 through the second pre-charging transistor Ma. Hence, the filter transistor Mc will be on. The low level signal from the clock signal terminal CLK is transmitted through the output terminal CLK_OUT to the shift register GOA. During the output stage of the gate drive unit, the second pre-charging transistor Ma is off, the second pull-up node PU2 is in a floating state, and the filter transistor Mc is tuned on. As such, a high level signal of the clock signal terminal CLK can pass through the filter transistor Mc to the filter output terminal CLK_OUT. Meanwhile, the voltage of the second pull-up node PU2 further rises due to bootstrapping of the second capacitor C2. During the reset stage, the second reset transistor Mb and the third reset transistor Md are turned on, and the filter transistor Mc is turned off. As such the low level signal of the first power terminal V1 is transmitted to the second pull-up node PU2 and the filter output terminal CLK_OUT. After the reset stage, the second pre-charging transistor Ma, the second reset transistor Mb, the third reset transistor Md, and the filter transistor Mc are all turned off. As such, the filter output terminal CLK_OUT stays at a low level voltage.

Figure 4:
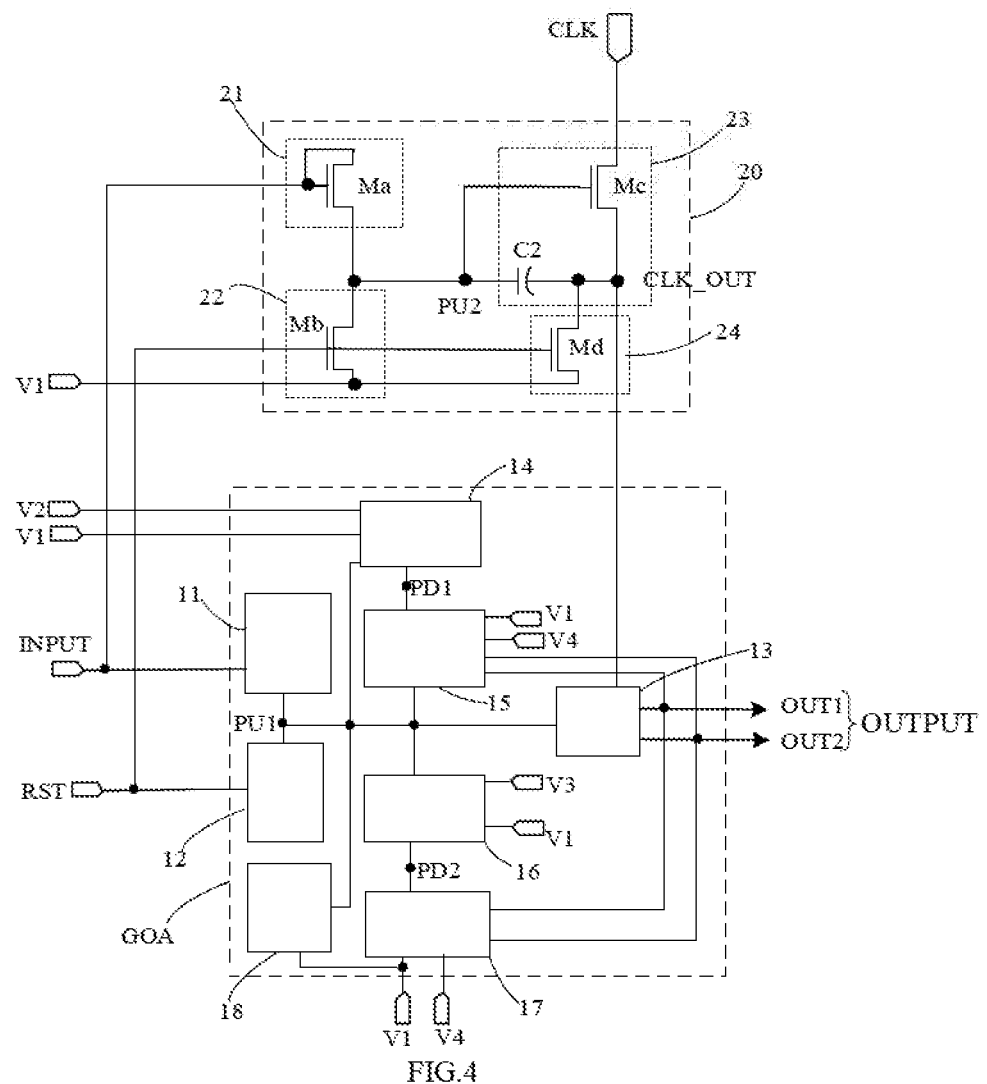
FIG. 4 is a schematic diagram of a gate drive unit according to some embodiments of the present disclosure.

FIG. 4 illustrates a gate drive unit according to some embodiments of the present disclosure. The gate drive unit comprises the signal filter 20 and the shift register GOA according to some embodiments of the present disclosure. The output terminal OUTPUT of the shift register GOA includes a first output terminal OUT1 and a second output terminal OUT2. The first output terminal OUT1 may be connected to the input terminal INPUT of the next-stage of shift register GOA. The second output terminal OUT2 may be connected to the corresponding gate line and the reset terminal RST of the previous-stage of shift register. The shift register GOA includes the first pre-charging circuit 11, the first reset circuit 12, the output circuit 13, and further includes a first pull-down control circuit 14, a first pull-down circuit 15, a second pull-down control circuit 16, and a second pull-down circuit 17.

The first pull-down control circuit 14 is respectively connected to the first pull-up node PU1, the first pull-down node PD, the first power terminal V1, and a second power terminal V2. The first pull-down control circuit is configured to transmit a signal supplied by the power terminal V1 to the first pull-down node PD1 when the first pull-up node PU1 is at the effective voltage, and transmit a signal supplied from the second power terminal V2 to the first pull-down node PD1 when the first pull-up node PU1 is at an ineffective voltage.

The first pull-down circuit 15 is respectively connected to the first pull-down node PD1, the first pull-up node PU1, the signal output terminal OUTPUT, the first power terminal V1 and a fourth power terminal V4. The first pull-down circuit is configured to, when the first pull-down node PD1 stays at the effective voltage, transmit the signal provided by the first power terminal V1 to the first pull-up node PU1 and the first output terminal OUT1, and transmit the signal from the fourth power terminal V4 to the second output terminal OUT2.

The second pull-down control circuit 16 is respectively connected to the first pull-up node PU1, the second pull-down node PD2, the first power terminal V1, and the third power terminal V3. The second pull-down control circuit is configured to transmit the signal from the first power terminal V1 to the second pull-down node PD2 when the first pull-up node PU1 is at an effective voltage, and transmit the signal from the third power terminal V3 to the second pull-down node PD2 when the first pull-up node PU1 is at an ineffective voltage.

The second pull-down circuit 17 is respectively connected to the second pull-down node PD2, the first pull-up node PU1, the signal output terminal OUTPUT, the first power terminal V1, and the fourth power terminal V4. The second pull-down circuit is configured to, when the second pull-down node PD2 is at an effective voltage, transmit the signal provided by the first power terminal V1 to the first pull-up node PU1 and the first output terminal OUT1, and also transmit the signal provided by the fourth power terminal V4 to the second output terminal OUT2.

The signals supplied by the second power terminal V2 and the third power terminal V3 switch between the effective and the ineffective voltages or levels. At any time, one of the signals from the terminals V2 and V3 stays at an effective voltage and the other is at an ineffective voltage.

Switching between the effective and ineffective voltages for the terminals of V2 and V3 activates the first pull-down control circuit 14 and the second pull-down control circuit 16 alternately, and the first pull-down circuit 15 and the second pull-down circuit 17 alternately. The alternate operation can extend the lifetime of the transistors and alleviate the threshold voltage drift in the long-time operation.

The second power terminal V2 and the third power terminal V3 may be switched between the effective and ineffective levels every operational cycle. For instance, in the Nth operational cycle, the second power terminal V2 may be set to the effective level and the third power terminal V3 is set to an ineffective level; and then in the N+1thoperational cycle, the second power terminal V2 is set to an ineffective voltage and the third power terminal V3 is set to an effective voltage. The switching time is flexible and can be determined based on the actual requirement.

Figure 5:
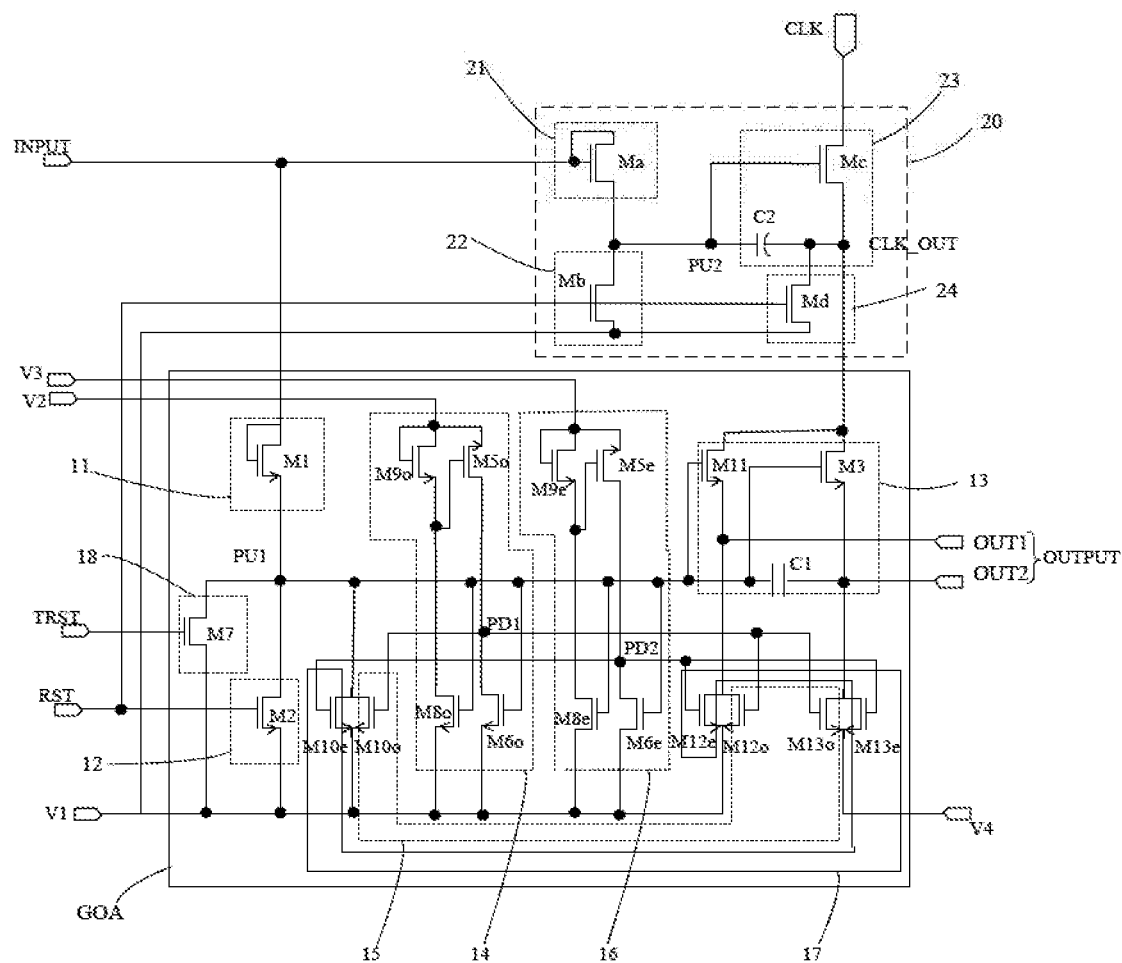
FIG. 5 is a schematic diagram of a gate drive unit according to some embodiments of the present disclosure.

FIG. 5 illustrates a schematic circuit of the gate drive unit as shown in FIG. 4. The signal filter adopts the configuration demonstrated in FIG. 3, That is, the signal filter includes the second pre-charging transistor Ma, the second reset transistor Me, the filter transistor Mc, the third reset transistor Md, and the second capacitor C2. The specific connection relationship between each transistor and the second capacitor C2 is as described above for FIG. 4, and is not repeated herein.

In one embodiment, the structure of the shift register GOA in FIG. 5 is described below:

The first pre-charging circuit 11 includes a first pre-charging transistor M1. The gate and the first terminal of the first pre-charging transistor M1 are both connected to the input terminal INPUT, and the second terminal of the first pre-charging transistor M1 and the first pull-up Node PU1 are connected.

The first reset circuit 12 includes: a first reset transistor M2. The gate of the first reset transistor M2 is connected to the reset terminal RST, the first terminal of the first reset transistor M2 is connected to the first pull-up node PU1, and the second terminal of the first reset transistor M2 is connected to the first power terminal V1.

The output circuit 13 includes a first output transistor M11, a second output transistor M3, and a first capacitor C1. The gate of the first output transistor M11 is connected to the first pull-up node PU1, the first terminal of the first output transistor M11 is connected to the filter output terminal CLK_OUT, and the second terminal of the first output transistor M11 is connected to the first output terminal OUT. The gate of the second output transistor M3 is connected to the first pull-up node PU1, the first terminal of the second output transistor M3 is connected to the filter output terminal CLK_OUT, and the second terminal of the second output transistor M3 is connected to the second output terminal OUT2. Both electrodes of the first capacitor C1 are respectively connected to the first pull-up node PU1 and the second output terminal OUT2.

The first pull-down control circuit 14 includes a first pull-down control transistor M9o, a second pull-down control transistor M5o, a third pull-down control transistor M8o, and a fourth pull-down control transistor M6o. The gate and the first terminal of the first pull-down control transistor M9o are both connected to the second power terminal V2. The second terminal of the first pull-down control transistor M9o is connected to the gate of the second pull-down control transistor M5o and the first terminal of the third pull-down control transistor M8o. The first terminal of the second pull-down control transistor M5o is connected to the second power terminal V2, and the second terminal of the second pull-down control transistor M5o is connected to the first pull-down node PD1. The gate of the third pull-down control transistor M8o is connected to the first pull-up node PU1, and the second terminal of the third pull-down control transistor M8o is connected to the first power terminal V1. The gate of the fourth pull-down control transistor M6o is connected to the first pull-up node PU1, the first terminal of the fourth pull-down control transistor M6o is connected to the first pull-down node PD1, and the second terminal of the fourth pull-down control transistor M6o is connected to the first power terminal V1.

The first pull-down circuit 15 includes a first pull-down transistor M10o, a second pull-down transistor M12o, and a third pull-down transistor M13o. The gate of the first pull-down transistor M10o, the gate of the second pull-down transistor M12o, and the gate of the third pull-down transistor M13o are all connected to the first pull-down node PD1. The first terminal of the first pull-down transistor M10o and the pull-up node PU1 are connected, and the second terminal of the first pull-down transistor M10o and the first power terminal V1 are connected. The first terminal of the second pull-down transistor M12o and the first output terminal OUT1 are connected and the second terminal of the second pull-down transistor M12o and the first power terminal V1 are connected. The first terminal of the third pull-down transistor M13o and the second output terminal OUT2 are connected and the second terminal of the third pull-down transistor M13o is connected to the fourth power terminal V4. The fourth power terminal V4 may supply a low level voltage.

In some embodiments of the present disclosure, the first power terminal V1 and the fourth power terminal V4 are two independent signal terminals. The reason for this setting is that the pixels of the display area and the pull-up node PU need to be discharged every time the display is turned off. When the electrical connection between the first power terminal V1 and the pull-up node PU is switched on, the pull-up node PU can discharge through V1. Raising the voltage of the fourth power terminal V4 and turning on the electrical connection between the fourth power terminal V4 and the second output terminal OUT2 may make the second output terminals OUT2 of all the gate drive units to output a high level signal, so that the charge stored in the pixels can be discharged into the data lines. Therefore, the signal output terminal have two output terminals: OUT1 and OUT2, and there are two power terminals: V1 and V4. The setting facilitates discharging of the pixels during the shutdown without affecting the voltage of the pull-up node PU in the gate drive unit.

The second pull-down control circuit 16 includes a fifth pull-down control transistor M9e, a sixth pull-down control transistor M5e, a seventh pull-down control transistor M8e, and an eighth pull-down control transistor M6e. The gate and the first terminal of the fifth pull-down control transistor M9e are both connected to the third power terminal V3. The second terminal of the fifth pull-down control transistor M9e is connected to the gate of the sixth pull-down control transistor M5e and the first terminal of the seventh pull-down control transistor M8e. The first terminal of the sixth pull-down control transistor M5e is connected to the third power terminal V3. The second terminal of the sixth pull-down control transistor M5e is connected to the second pull-down node PD2. The gate of the seventh pull-down control transistor M8e is connected to the first pull-up node PU1 and the second terminal of the seventh pull-down control transistor M8e is connected to the first power terminal V1. The gate of the eighth pull-down control transistor M6e is connected to the first pull-up node PU1, the first terminal of the eighth pull-down control transistor M6e is connected to the second pull-down node PD2, and the second terminal of the eighth pull-down control transistor M6e is connected to the first power Terminal V1.

The second pull-down circuit 17 includes a fourth pull-down transistor M10e, a fifth pull-down transistor M12e, and a sixth pull-down transistor M13e. The gates of the fourth pull-down transistor M10e, the fifth pull-down transistor M12e and the sixth pull-down transistor M13e are respectively connected to the second pull-down node PD2. The first terminal of the fourth pull-down transistor M10e is connected to the first pull-up node PU1 and the second terminal of the fourth pull-down transistor M10e is connected to the first power terminal V1. The first terminal of the fifth pull-down transistor M12e is connected to the first output terminal OUT1 and the second terminal of the fifth pull-down transistor M12e is connected to the first power terminal V1. The first terminal of the sixth pull-down transistor M3e is connected to the second output terminal OUT2 and the second terminal of the sixth pull-down transistor M13e is connected to the fourth power terminal V4.

In one embodiment, the shift register GOA further includes a reset circuit 18. The reset circuit 18 is respectively connected to the first pull-up node PU1, the first supply terminal V1 and a reset terminal TRST. The rest circuit 18 is configured to, under an effective signal from the reset terminal TRST, transmit the signal of the first power terminal V1 to the first pull-up node PU1. The reset terminal TRST may provide the effective signal at the beginning of each frame, i.e. before the input stage of the first-stage of gate drive unit, thereby resetting the first pull-up node PU1.

In one embodiment, the reset circuit 18 includes a reset transistor M7. The gate of the reset transistor M7 is connected to the reset terminal TRST. The first terminal of the reset transistor M7 is connected to the first pull-up node PU1 and the second terminal of the reset transistor M7 is connected to the first power terminal V1.

Figure 6:
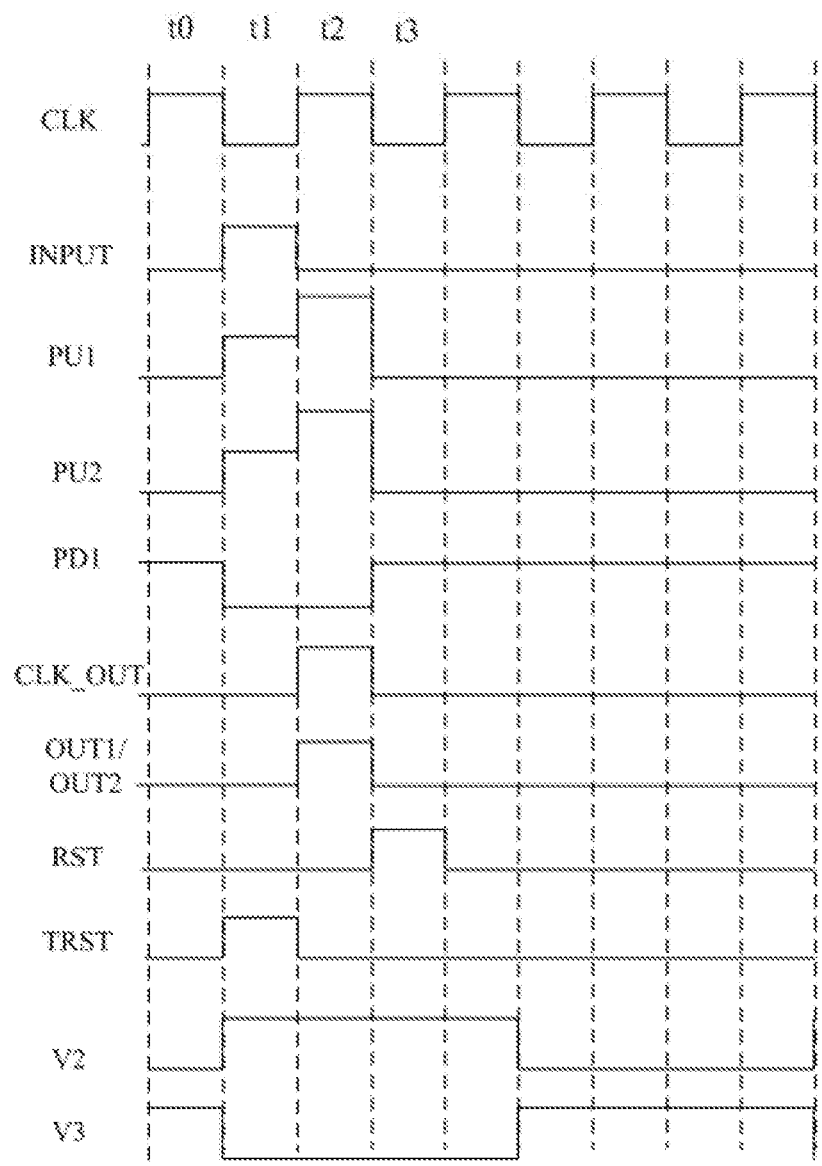
FIG. 6 is a timing diagram showing the operation of the gate drive unit in FIG. 5.

FIG. 6 is an operational timing diagram of the gate drive unit shown in FIG. 5. As shown in FIG. 6, the first power terminal V1 and the fourth power terminal V4 may continuously supply a low level signal, and the second power terminal V2 and the third power terminal V3 may supply a high level signal and a low level signal alternately. Furthermore, when one of the second power terminal V2 and the third power terminal V3 provides a high level signal, the other provides a low level signal. The following is an example in which the second power terminal V2 supplies a high level signal and the third power terminal V3 supplies a low level signal. The operation of the gate drive unit will be described with reference to FIGS. 5 and 6.

At the reset stage t0, the reset terminal TRST provides a high level signal and the reset transistor M7 is turned on, thereby transmitting the low level signal provided by the first power terminal V1 to the first pull-up node PU1.

At the pre-charging stage t1, the signal of the clock signal terminal CLK is at a high level, the input terminal INPUT provides a high level signal, and the reset terminal RST provides a low level signal.

Meanwhile, the second pre-charging transistor Ma is turned on and the second reset transistor Mb is turned off. The input terminal INPUT charges the second pull-up node PU2 through the second pre-charge transistor Ma to bring the second pull-up node PU2 to a high level. Under control of the high level voltage of the second pull-up node PU2, the filter transistor Mc is turned on, and the high level signal of the clock signal terminal CLK is transmitted to the filter output terminal CLK_OUT.

In addition, the first pre-charge transistor M1 is turned on and the first reset transistor M2 is turned off. The input terminal INPUT charges the first pull-up node PU1 to a high level through the first pre-charge transistor M1. Under control of the high level voltage of the first pull-up node PU1, the third pull-down control transistor M8o, the fourth pull-down control transistor M6o, the seventh pull-down control transistor M8e, and the eighth pull-down control transistor M6e are turned on. Therefore, a low level signal of the power terminal V1 is transmitted to the gate of the second pull-down control transistor M5o through the third pull-down control transistor M8o, thereby turning off the second pull-down control transistor M5o; a low level signal of the first power terminal V1 is transmitted to the first pull-down node PD through the fourth pull-down control transistor M6o, thereby turning off the first pull-down transistor M10o, the second pull-down transistor M12o and the third pull-down transistor M13o; a low level signal of the first power terminal V1 is transmitted to the gate of the sixth pull-down control transistor M5e through the seventh pull-down control transistor M8e, thereby turning off the sixth pull-down control transistor M5e; a low level signal of the first terminal V1 is transmitted to the second pull-down node PD2 through the eighth-down control transistor M6e, thereby turning off the fourth pull-down transistor M10e, the fifth pull-down transistor M2e, and the sixth pull-down transistor M13e.

At the same time, under control of a high level voltage of the first pull-up node PU1, the first output transistor M1 and the second output transistor M3 are turned on. As such, the low level signal of the filter output terminal CLK_OUT is transmitted to the first output terminal OUT 1 through the first output transistor M11, and to the second output terminal OUT2 through the second output transistor M3.

At the output stage t2, the clock signal of the clock signal terminal CLK is at a high level, and the input terminal INPUT and the reset terminal RST are at a low level.

Meanwhile, the first pre-charging transistor M1 and the first reset transistor M2 are turned off. The first pull-up node PU1 is in a floating state. The transistors in the first pull-down control circuit 14, the second pull-down control circuit 16, the first pull-down circuit 15, and the second pull-down circuit 17, the first output transistor M11, and the second output transistor M3 maintain the states of the pre-charging stage.

As the first output transistor M11 and the second output transistor M3 are on, a high level signal of the clock signal terminal CLK is transmitted to the first output terminal OUT1 through the first output transistor M11, and to the second output terminal OUT2 through the second output transistor M3. At the same time, due to the bootstrapping effect of the first capacitor C1, the voltage of the first pull-up node PU1 is further increased; as the bootstrapping effect acts on the second capacitor C2, the voltage of the second pull-up node PU2 is also further increased.

At the reset stage t3, the clock signal of the clock signal terminal CLK is at a low level, the input terminal INPUT provides a low level signal, and the reset terminal RST provides a high level signal.

Meanwhile, the second pre-charging transistor Ma is turned off and the second reset transistor Mb and the third reset transistor Md are turned on. A low level signal of the first power terminal V1 is transmitted to the second pull-up node PU2 through the second reset transistor Mb. Under control of the low level voltage of the second pull-up node PU2, the filter transistor Mc is turned off. Moreover, the low level signal of the first power terminal V1 is transmitted to the filter output terminal CLK_OUT through the third reset transistor Md, so that the first terminal of the first output transistor M11 and the first terminal of the second output transistor M3 receive the low level signal.

Furthermore, the first pre-charging transistor M1 is turned off and the first reset transistor M2 is turned on. As such, the low level signal of the first power terminal V1 is transmitted to the first pull-up node PU1 through the first reset transistor M2, thereby resetting the first pull-up PU1 to a low level voltage.

Since the first pull-up node PU1 is at a low level, the third pull-down control transistor M8o, the fourth pull-down control transistor M6o, the seventh pull-down control transistor M8e, the eighth pull-down control transistor M6e are turned off. At this time, the first pull-down control transistor M9o and the fifth pull-down control transistor M9e act with high resistance, a high level signal of the second power terminal V2 is transmitted to the gate of the second pull-down control transistor M5o through the first pull-down control transistor M9o, thereby turning off the second pull-down control transistor M5o. A high level signal of the second power terminal V2 is transmitted to the first pull-down node PD through the second pull-down control transistor M5o, thereby turning on the first pull-down transistor M10o, the second pull-down transistor M12o, and the third pull-down transistor M13o.

As the third power terminal V3 provides a low level signal, the fifth pull-down control transistor M9e is turned off the gate of the sixth pull-down control transistor M5e stays at the low level of the output stage, thereby turning off the sixth pull-down control transistor M5e. The second pull-down node PD2 in turn maintains the low level voltage of the output stage. Therefore, the fourth pull-down transistor M10e, the fifth pull-down transistor M12e, and the sixth pull-down transistor M13e are all turned off.

As the first pull-down transistor M10o, the second pull-down transistor M12o, and the third pull-down transistor M3o are turned on, a low level signal of the first power terminal V1 is transmitted to the first pull-up node PU1 and the first output terminal OUT1 through the first pull-down transistor M10o and the second pull-down transistor M12o, respectively. A low level signal of the fourth power terminal V4 is transmitted to the second output terminal OUT2 through the third pull-down transistor M13o.

If the second power terminal V2 provides a low level signal and the third power terminal V3 provides a high level signal, the transistors in the gate drive unit operate at similar states as those when the second power terminal V2 provides a high level signal except that the states of the second pull-down control circuit 16 and the first pull-down control circuit 14 are switched, and the states of the first pull-down circuit 15 and the second pull-down circuit 17 are switched. For example, the operating state of the first pull-down control transistor M9o when the second power terminal V2 provides a low level signal, is the same as the operating state of the fifth pull-down control transistor M9e when the second power terminal V2 provides a high level signal; the operating state of the first pull-down transistor M10o when the second power terminal V2 provides a low level signal is the same as that of the fourth pull-down transistor M10e when the second power terminal V2 provides a high level signal.

During the time period between the end of the reset stage t3 to the reset stage t 0 of the next working cycle, the input terminal INPUT and the reset terminal RST provide a low level signal, the clock signal terminal CLK provides a clock signal switching between high and low levels. Therefore, the second pre-charging transistor Ma, the second reset transistor Mb, the third transistor Md, and the filter transistor Mc are all turned off and the second pull-up node PU2 and the filter output terminal CLK_OUT are maintained at a low level.

If the second power terminal V2 provides a high level signal and the third power terminal V3 provides a low level signal, the first pull-down node PD1 is at a high level, the second pull-down node PD2 is at a low level. As such, the second pull-down transistor M12o and the third pull-down transistor M13o are turned on, the fifth pull-down transistor M12e and the sixth pull-down transistor M13e are turned off. If the second power terminal V2 provides a low level signal and the third power terminal V3 provides a high level signal, the first pull-down node PD1 is at a low level, the second pull-down node PD2 is at a high level, the second pull-down transistor M12o and the third pull-down transistor M13o are turned off and the fifth pull-down transistor M12e and the sixth pull-down transistor M13e are on. Therefore, during the time period between the end of the reset stage t3 to the reset stage t0 of the next working cycle, one of the second pull-down transistor M12o or the fifth pull-down transistor M12e remains on, one of the third pull-down transistor M13o or the sixth pull-down transistor M13e remains on, and the first output terminal OUT1 and the second output terminal OUT2 maintain a low level output. Moreover, one of the first pull-down transistor M10o and the fourth pull-down transistor M10e remains on so that the first pull-up node PU1 maintains a low level voltage.

In the gate drive circuit with the multi-stage gate drive units, the reset and input stages of the first-stage of the gate drive unit are adjacent, but the reset and input stages of the other gate drive units are not adjacent.

It should be noted that the shift register GOA is not limited to the 19T1C configuration as described above and other configurations may be employed.

The above description indicates the filter output terminal CLK_OUT is at a low level after the reset stage so that there are no high level signals supplied to the output transistor of the shift register GOA. Thus, after the reset stage, there is no noise output. Hence, the structure of the shift register GOA can be simplified due to the noise reduction. For example, the first pull-down control circuit 14, the second pull-down control circuit 16, the first pull-down unit 15 and second pull-down unit 17 may be omitted from the shift register GOA.

The present disclosure also provides a method for driving a gate drive unit. The gate drive unit is the gate drive unit according to some embodiments of the present disclosure. The driving method includes:

In the pre-charging stage, the input terminal provides an effective signal and the clock signal terminal provides an ineffective signal. The signal filter transmits the ineffective signal to the filter output terminal. The first pre-charging circuit transmits the effective signal from the input terminal to the first pull-up node. The output circuit transmits the ineffective signal of the filter output terminal to the signal output terminal.

In the output stage, the input terminal provides an ineffective signal and the clock signal terminal provides an effective signal. The signal filter transmits the effective signal provided by the clock signal terminal to the filter output terminal and the output circuit transmits the effective signal from the filter output terminal to the signal output terminal.

In the reset stage, the reset terminal provides a effective signal. The first reset circuit transmits the ineffective signal provided by the first power terminal to the first pull-up node. The signal filter disconnects the clock signal terminal from the filter output terminal.

Each stage in the operating cycle of the gate drive unit may refer to the operation of the gate drive unit as described above, and is not repeated herein.

Figure 7:
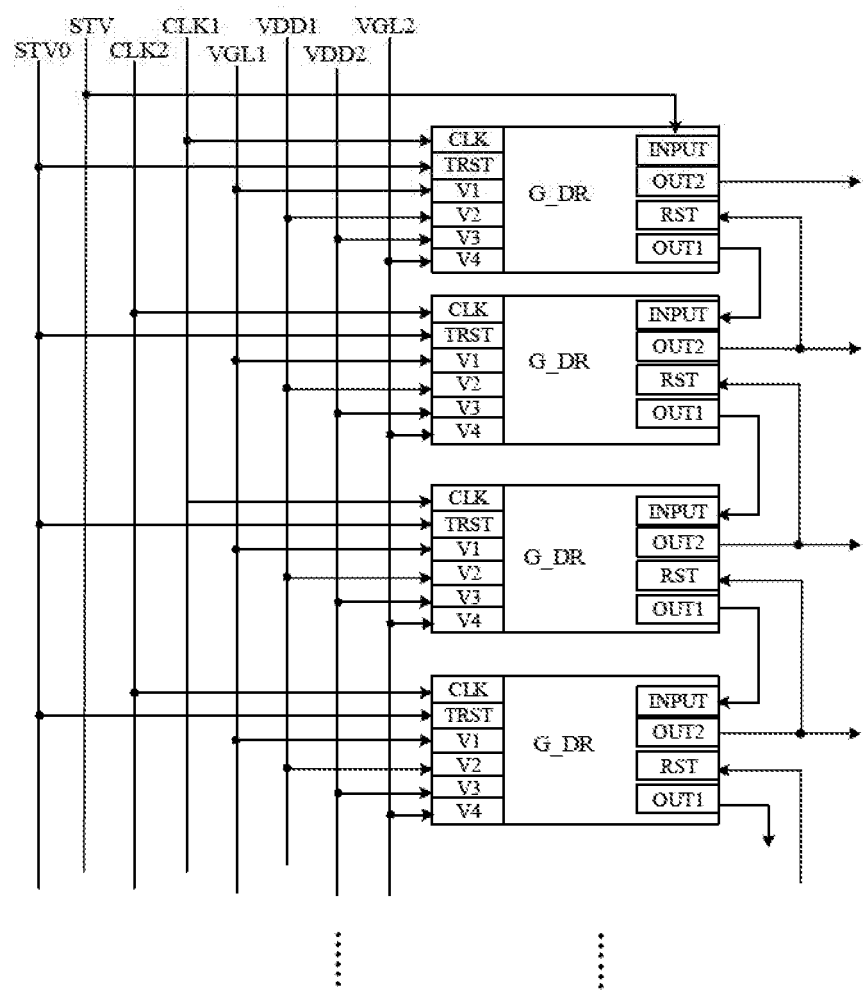
FIG. 7 is a schematic diagram of a gate drive circuit according to some embodiments of the present disclosure.

FIG. 7 provides a schematic diagram of a gate drive circuit in some embodiments of the present disclosure. The gate drive circuit includes a plurality of cascaded gate drive units G_DR. The gate drive unit G_DR may be any of the gate drive units as described in the embodiments above. Except in the gate drive unit G_DR of the last stage, the output terminal OUT1 in each of the gate drive units G_DR is connected to the input terminal in the gate drive unit of the next stage. Except in the gate drive unit G_DR of the first-stage, the output terminal OUT2 of each of the other gate drive units is connected to the reset terminal RST in the gate drive unit G_DR of the previous stage.

In one embodiment, as shown in FIG. 7, the gate drive circuit further includes: a first power line VGL1, a second power line VDD1, a third power line VDD2, a fourth power line VGL 2, a reset signal line STV0, and a frame signal line STV, a first clock signal line CLK1, and a second clock signal line CLK2. The reset signal line STV0 is connected to the reset terminals TRSTs of the gate drive units. The fame signal line STV is connected to the input terminal INPUT of the first-stage gate drive unit G_DR. The clock signal terminals CLK of the gate drive units in the odd number stages are connected to the first clock signal line CLK1. The clock signal terminals CLK of the gate drive units in the even number stages are connected to the second clock signal line CLK2. The first power supply terminals V1 of all stages of the gate drive units are connected to the first power line VGL1. The second power supply terminals V2 of all stages of the gate drive units are connected to the second power supply line VGL2. The third supply terminals V3 of all stages of the gate drive units are connected to the third power source line VGL3. The fourth power supply terminals V4 of all stages of the gate drive units are connected to the fourth power line VGL4.

Figure 8:
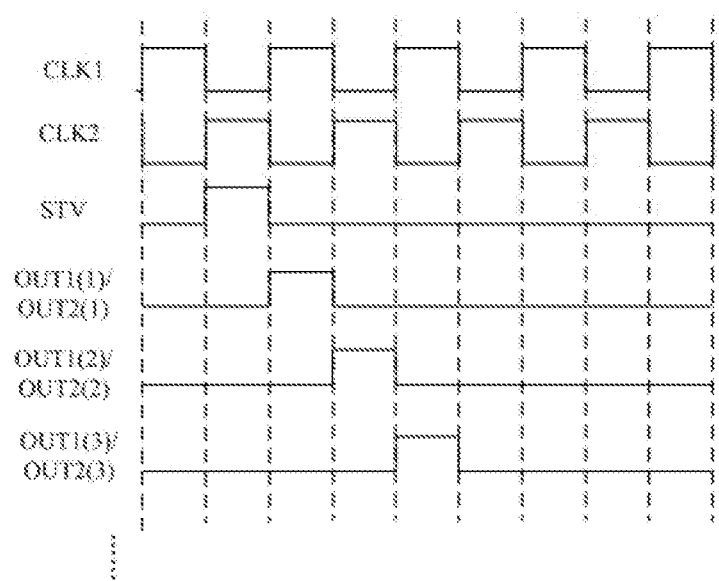
FIG. 8 is a timing diagram of the gate drive circuit according to some embodiments of the present disclosure.

FIG. 8 is a timing diagram of the gate drive circuit according to some embodiments of the present disclosure.

OUT1 (1) and OUT2 (1) refer to the output signals of the first output terminal and the second output terminal of the first-stage gate drive unit, respectively. OUT1 (2) and OUT2 (2) refer to the output signals of the first output terminal and the second output terminal of the second-stage gate drive unit, respectively. OUT1 (3) and OUT2 (3) refer to the output signals of the first output terminal and the second output terminal of the third-stage gate drive unit, respectively. As shown in FIG. 8, the duty ratio of the clock signals provided by the first clock signal line CLK1 and the second clock signal line CLK2 is ½Furthermore, one of the clock signals supplied from the first clock signal line CLK1 and the second clock signal line CLK2 is in a high level, and the other is in a low level. Each of the gate drive units sequentially outputs a high level signal.

Another embodiment of the present disclosure provides a display apparatus including the gate drive circuit in some embodiments of the present disclosure.

In one embodiment, the display apparatus includes a display panel, the display panel comprises an array substrate, wherein the array substrate includes a plurality of gate lines and a plurality of date lines. The second output terminals of the gate drive units in the gate drive circuit are correspondingly connected to the gate lines, thereby sequentially providing scanning signals to the plurality of gate lines.

In one embodiment, the display panel comprises a plurality of pixels, each of the plurality of pixels is connected to one of the plurality of date lines and one of the plurality of cascaded gate drive units.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A gate drive unit, comprising:
  a shift register; and
  a signal filter;
  wherein the gate drive unit includes a clock signal terminal, a filter output terminal, an input terminal and a reset terminal, and the signal filter is respectively connected to the clock signal terminal, the filter output terminal, the input terminal and the reset terminal;
  the signal filter is configured, under control of an effective signal provided by the input terminal, to transmit a clock signal of the clock signal terminal to the filter output terminal after the input terminal stops providing the effective signal and before the reset terminal provides an effective signal and, under control of an effective signal provided by the reset terminal, to disconnect the clock signal terminal and the filter output terminal; and
  the filter output terminal is connected to an output circuit of the shift register for transmitting the clock signal of the clock signal terminal to the output circuit of the shift register.

2. The gate drive unit according to claim 1, wherein the shift register comprises a first pre-charging circuit, the output circuit, and a first reset circuit;
  the first pre-charging circuit is connected to the input terminal and a first pull-up node, and is configured to pre-charge the first pull-up node under control of the effective signal provided by the input terminal;
  the first reset circuit is connected to the reset terminal, the first pull-up node, and a first power terminal, and is configured to transmit, under control of the effective signal provided by the reset terminal, a signal provided by the first power terminal to the first pull-up node; and
  the output circuit is connected to the filter output terminal, the first pull-up node and a signal output terminal, and is configured to transmit a signal of the filter output terminal to the signal output terminal when the first pull-up node is at an effective potential.

3. The gate drive unit according to claim 2, wherein the signal filter comprises a second pre-charging circuit, a second reset circuit, and a filter circuit;
  wherein the second pre-charging circuit is connected to the input terminal and a second pull-up node, and is configured to pre-charge the second pull-up node under control of the effective signal provided by the input terminal;
  wherein the filter circuit is connected to the second pull-up node, the clock signal terminal, and the filter output terminal, and is configured to transmit the clock signal from the clock signal terminal to the filter output terminal when the second pull-up node is at an effective potential; and
  wherein the second reset circuit is connected to the reset terminal, the second pull-up node and the first power terminal, and is configured to transmit the signal of the first power terminal to the second pull-up node under control of an effective signal provided by the reset terminal.

4. The gate drive unit according to claim 3, wherein the second pre-charging circuit comprises a second pre-charging transistor; a gate and a first terminal of the second pre-charging transistor are connected to the input terminal, and a second terminal of the second pre-charging transistor is connected to the second pull-up node.

5. The gate drive unit according to claim 3, wherein the second reset circuit comprises a second reset transistor, a gate of the second reset transistor is connected to the reset terminal, a first terminal of the second reset transistor is connected to the second pull-up node, and a second terminal of the second reset transistor is connected to the first power terminal.

6. The gate drive unit according to claim 3, wherein the filter circuit comprises a filter transistor and a second capacitor; a gate of the filter transistor is connected to the second pull-up node, a first terminal of the filter transistor is connected to the clock signal terminal, a second terminal of the filter transistor is connected to the filter output terminal, and two electrodes of the second capacitor are respectively connected to the second pull-up node and the filter output terminal.

7. The gate drive unit according to claim 3, wherein the signal filter further comprises a third reset circuit, the third reset circuit is connected to the reset terminal, the filter output terminal, the first power terminal, and is configured to transmit the signal of the first power terminal to the filter output terminal under control of the effective signal provided by the reset terminal.

8. The gate drive unit according to claim 7, wherein the third reset circuit comprises a third reset transistor; a gate of the third reset transistor is connected to the reset terminal, a first terminal of the third reset transistor is connected to the filter output terminal, and a second terminal of the third reset transistor is connected to the first power terminal.

9. The gate drive unit according to claim 2, wherein the first pre-charging circuit comprises a first pre-charging transistor; a gate and a first terminal of the first pre-charging transistor are connected to the input terminal, and a second terminal of the first pre-charging transistor is connected to the first pull-up node; and
wherein the first reset circuit comprises a first reset transistor; a gate of the first reset transistor is connected to the reset terminal, a first terminal of the first reset transistor is connected to the first pull-up node, and a second terminal of the reset transistor is connected to the first power terminal.

10. The gate drive unit according to claim 2, wherein the signal output terminal comprises a first output terminal and a second output terminal;
wherein the output circuit comprises a first output transistor, a second output transistor, and a first capacitor; a gate of the first output transistor is connected to the first pull-up node, a first terminal of the first output transistor is connected to the filter output terminal, and a second terminal of the first output transistor is connected to the first output terminal; a gate of the second output transistor is connected to the first pull-up node, a first terminal of the second output transistor is connected to the filter output terminal, a second terminal of the first output transistor is connected to the second output terminal; and two electrodes of the first capacitor are respectively connected to the first pull-up node and the second output terminal.

11. The gate drive unit according to claim 2, wherein the signal output terminal comprises a first output terminal and a second output terminal; wherein the shift register further comprises a first pull-down control circuit, a first pull-down circuit, a second pull-down control circuit, and a second pull-down circuit;
the first pull-down control circuit is connected to the first pull-up node, a first pull-down node, the first power terminal and a second power terminal; and is configured to transmit a signal from the first power terminal to the first pull-down node when the first pull-up node is at an effective potential, and to transmit a signal from the second power terminal to the first pull-down node when the first pull-up node is at an ineffective potential;
the first pull-down circuit is connected to the first pull-down node, the first pull-up node, the signal output terminal, the first power terminal and a fourth power terminal, and is configured to transmit the signal from the first power terminal to the first pull-up node and the first output terminal and to transmit a signal from the fourth power terminal to the second output terminal when the first pull-down node is at an effective potential;
the second pull-down control circuit is connected to the first pull-up node, a second pull-down node, the first power terminal, and a third power terminal, and is configured to transmit the signal from the first power terminal to the second pull-down node when the first pull-up node is at an effective potential and to transmit a signal from the third power terminal to the second pull-down node when the first pull-up node is at an ineffective potential;
the second pull-down circuit is connected to the second pull-down node, the first pull-up node, the signal output terminal, the first power terminal, and the fourth power terminal, and is configured to transmit the signal from the first power terminal to the first pull-up node and the first output terminal and transmit the signal from the fourth power terminal to the second output terminal when the second pull-down node is at an effective voltage;
wherein the signals from the second power terminal and the third power terminal are signals switching between an effective voltage and an ineffective voltage; and one of the signals from the second power terminal and the third power terminal is at the effective voltage and the other is at the ineffective voltage.

12. The gate drive unit according to claim 11, wherein the first pull-down control circuit comprises a first pull-down control transistor, a second pull-down control transistor, a third pull-down control transistor and a fourth pull-down control transistor;
a gate and a first terminal of the first pull-down control transistor are connected to the second power terminal, a second terminal of the first pull-down control transistor is connected to a gate of the second pull-down control transistor and a first terminal of the third pull-down transistor;
a first terminal of the second pull-down control transistor is connected to the second power terminal, and a second terminal of the second pull-down control transistor is connected to the first pull-down node;
a gate of the third pull-down control transistor is connected to the first pull-up node, and a second terminal of the third pull-down control transistor is connected to the first power terminal; and
a gate of the fourth pull-down control transistor is connected to the first pull-up node, a first terminal of the fourth pull-down control transistor is connected to the first pull-down node, and a second terminal of the fourth pull-down control transistor is connected to the first power terminal.

13. The gate drive unit according to claim 11, wherein the first pull-down circuit comprises a first pull-down transistor, a second pull-down transistor, and a third pull-down transistor;
a gate of the first pull-down transistor, a gate of the second pull-down transistor and a gate of the third pull-down transistor are connected to the first pull-down node, a first terminal of the first pull-down transistor is connected to the first pull-up node, and a second terminal of the first pull-down transistor is connected to the first power terminal;
a first terminal of the second pull-down transistor is connected to the first output terminal, and a second terminal of the second pull-down transistor is connected to the first power terminal; and
a first terminal of the third pull-down transistor is connected to the second output terminal, and a second terminal of the third pull-down transistor is connected to the fourth power terminal.

14. The gate drive unit according to claim 11, wherein the second pull-down control circuit comprises a fifth pull-down control transistor, a sixth pull-down control transistor, a seventh pull-down control transistor and an eighth pull-down control transistor;
a gate and a first terminal of the fifth pull-down control transistor are connected to the third power terminal, a second terminal of the fifth pull-down control transistor is connected to a gate of the sixth pull-down control transistor and a first terminal of the seventh pull-down control transistor;

a first terminal of the sixth pull-down control transistor is connected to the third power terminal, and a second terminal of the sixth pull-down control transistor is connected to the second pull-down node;

a gate of the seventh pull-down control transistor is connected to the first pull-up node, and a second terminal of the seventh pull-down control transistor is connected to the first power terminal; and a gate of the eighth pull-down control transistor is connected to the first pull-up node, a first terminal of the eighth pull-down control transistor is connected to the second pull-down node, and a second terminal of the eighth pull-down control transistor is connected to the first power terminal.

15. The gate drive unit according to claim 11, wherein the second pull-down circuit comprises a fourth pull-down transistor, a fifth pull-down transistor, and a sixth pull-down transistor;

gates of the four pull-down transistor, the fifth pull-down transistor and the sixth pull-down transistors are connected to the second pull-down node, a first terminal of the fourth pull-down transistor is connected to the first pull-up node, and a second terminal of the fourth pull-down transistor is connected to the first power terminal;

a first terminal of the fifth transistor is connected to the first output terminal, and a second terminal of the fifth pull-down transistor is connected to the first power terminal; and a first terminal of the sixth pull-down transistor is connected to the second output terminal, and a second terminal of the six pull-down transistor is connected to the fourth power terminal.

16. A method for driving the gate drive unit according to claim 1, comprising:

providing an effective signal at the input terminal and an ineffective signal at the clock signal terminal during a pre-charging stage;

providing an ineffective signal at the input terminal and an effective signal at the clock signal terminal during an output stage; and providing an effective signal at the reset terminal during a reset stage.

17. A gate drive circuit, comprising a plurality of cascaded gate drive units, at least one of the plurality of cascaded gate drive units comprising the gate drive unit according to claim 1.

18. The gate drive circuit according to claim 17, wherein, except for the gate drive unit of the last stage, a signal output terminal of any of the gate drive units is connected to an input terminal of a gate drive unit of the next stage; and wherein, except for the gate drive unit of the first stage, a first output terminal of any of the gate drive units is connected to a reset terminal of the gate drive unit of the previous stage.

19. A display apparatus, comprising a display panel and the gate drive circuit according to claim 17.

20. The display apparatus according to claim 19, wherein the display panel comprises a plurality of pixels, each of the plurality of pixels is connected to a date line and one of the plurality of cascaded gate drive units, the one of the plurality of cascaded gate drive units comprises a pull-up node, a first power terminal, a fourth power terminal, and a second output terminal, when the display apparatus is powered off, the pull-up node discharges through the first power terminal when an electrical connection between the first power terminal and the pull-up node is switched on; and raising a voltage of the fourth power terminal and turning on an electrical connection between the fourth power terminal and the second output terminal make the second output terminal to output an effective signal, thereby discharging charges stored in pixels into a data line.

* * * * *